(12) United States Patent
Gattuso

(10) Patent No.: US 8,342,871 B2
(45) Date of Patent: Jan. 1, 2013

(54) SOCKET CONNECTOR HAVING A HOUSING WITH A LATCHING BLOCK AND A RETENTION PLATE WITH A LATCHING ARM

(75) Inventor: Andrew David Gattuso, Chandler, AZ (US)

(73) Assignee: Hon Hai Precision Ind. Co., Ltd

( * ) Notice: Subject to any disclaimer, the term of this patent is extended or adjusted under 35 U.S.C. 154(b) by 0 days.

(21) Appl. No.: 13/115,089

(22) Filed: May 24, 2011

(65) Prior Publication Data

US 2012/0302082 A1 Nov. 29, 2012

(51) Int. Cl.
*H01R 13/62* (2006.01)
(52) U.S. Cl. .................................................. 439/331
(58) Field of Classification Search .............. 439/326, 439/331
See application file for complete search history.

(56) References Cited

U.S. PATENT DOCUMENTS

| | | | | |
|---|---|---|---|---|
| 5,000,696 | A * | 3/1991 | Matsuoka et al. | 439/331 |
| 5,044,810 | A * | 9/1991 | Matsuoka et al. | 403/93 |
| 7,083,456 | B2 | 8/2006 | Trout et al. | |
| 7,507,101 | B2 | 3/2009 | Chiang | |
| 7,972,162 | B2 * | 7/2011 | Hsu | 439/326 |
| 8,062,048 | B2 * | 11/2011 | Ma | 439/331 |
| 2010/0055939 | A1 * | 3/2010 | Hsu | 439/73 |
| 2010/0105236 | A1 * | 4/2010 | Mao | 439/331 |

* cited by examiner

*Primary Examiner* — Chandrika Prasad
(74) *Attorney, Agent, or Firm* — Wei Te Chung; Ming Chieh Chang

(57) ABSTRACT

A socket connector which includes a socket body having a plurality of contacts received therein, and a retention plate pivotally connected to a rear end of the socket body. The socket body has a substantially rectangular structure defining a rear wall, a front wall, and a pair of opposite sidewalls. Each sidewall is formed with a latching block and a pivot adjacent each other. The retention plate has a pair of latching arms in correspondence to the latching blocks and the pivots. The latching arm includes a latching section engageable with the lathing block, a lever section engageable with the pivot, and a handle at a free end thereof.

20 Claims, 5 Drawing Sheets

SOCKET CONNECTOR HAVING A HOUSING WITH A LATCHING BLOCK AND A RETENTION PLATE WITH A LATCHING ARM

CROSS-REFERENCE TO RELATED APPLICATIONS

This patent application relates to a co-pending U.S. patent application Ser. No. 13/069,388 filed on Mar. 23, 2010, entitled "SOCKET CONNECTOR HAVING RETAINING PLATE WITH HORIZONTALLY ACTUATED LOCKING TABS", which has the same inventor and assignee as the present application.

BACKGROUND OF THE INVENTION

1. Field of the Invention

The present invention relates to a socket connector, and more particularly to a socket connector with a retention plate pivotally assembled thereto. The retention plate is locked thereto by means of interengagement between a tab from the retention platen and an embossment from the socket connector.

2. Description of Related Art

An IC (Integrated Circuit) package, such as a CPU (Central Processing Unit), is generally coupled with a system via a socket connector mounted on a mother board. The socket connector at least includes one socket body having a plurality of contacts received therein. To pre-position the CPU, a retention plate incorporated for implementing the purpose is usually provided. The retention plate is mostly connected to one end of the socket body in a rotatable manner and is able to be maneuvered to rotate between a closed position where it covers the socket body and an opened position where it's moved away from the socket body. When the CPU is seated upon the socket body, the retention plate could be maneuvered again by a user toward the socket body and applies depressing force to the periphery of the CPU. The retention plate also has a window thereof at a central position, allowing an external heat-sink to directly contact a top surface of the CPU. The retention plate also servers to evenly distribute the force applied on the CPU from an external loading arrangement.

The retention plate has a latching-releasing member engaged with the socket body. Referring to the disclosure of U.S. Pat. No. 7,083,456 issued to Trout et al. on Aug. 1, 2006, a socket connector includes a socket body on which a CPU is mounted and a retention plate rotatable with respect to the socket body. Referring to FIGS. 1-6 of Trout, a front end section 40 of the retention plate 14 includes a latch element 90 that engages the retention plate 14 to hold the retention plate 14 in a closed position. The latch element 90 includes a beveled engagement surface 92 and a latching surface 94. The latch element 90 is pivotable in the directions of arrows A and B to latch and release the retention plate 14, with the latch element 90 being biased in the direction of arrow B.

U.S. Pat. No. 7,507,101 issued to Chiang on Mar. 24, 2009 discloses a socket connector having another type of latching-releasing manners for a retention plate. Referring to FIGS. 1-6 of Chiang, a front portion of the retention plate 3 has an elastic locking device which has a U-shaped elastic arm 30. The front end of the elastic arm 30 is a free end and has two hooks 301 that are located at both sides of the elastic arm 30. The front portion of the socket body 1 is also provided with a locking device which has two protruding blocks 12, two blocking portions 121 and two recessed troughs 122. A notch 13 is provided between the protruding blocks 12. The blocking portions 121 are formed on upper edges of the opposing insides of the protruding blocks 12. The recessed troughs 122 are formed on the rear sides of the blocking portions 121. When the front portion of the retention plate 3 is moved to a front portion of a socket body 1, the free end of the elastic arm 30 is pressed to move downwardly, so that the hooks 301 pass through the recessed troughs 122 respectively. Subsequently, the free ends of elastic arm 30 are released, so that the hooks 301 of the free end of the elastic arm 30 are hooked under the blocking portions 121 of the locking device of the socket body 1. The elastic locking device is accommodated in the notch 13, so that the elastic locking device on the front portion of the retention plate 3 is detachably locked to the locking device on the front portion of the socket body 1.

SUMMARY OF THE INVENTION

An object of the present invention is to provide a socket connector having a lever-type latching-releasing arrangement which has a simplified structure and is easier to be operated by a user.

According to one aspect of the present invention there is provided a socket connector which includes a socket body having a plurality of contacts received therein, and a retention plate pivotally connected to a rear end of the socket body. The socket body has a substantially rectangular structure defining a rear wall, a front wall, and a pair of opposite sidewalls. Each sidewall is formed with a latching block and a pivot adjacent each other. The retention plate has a pair of latching arms in correspondence to the latching blocks and the pivots. The latching arm includes a latching section engageable with the lathing block, a lever section engageable with the pivot, and a handle at a free end thereof.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
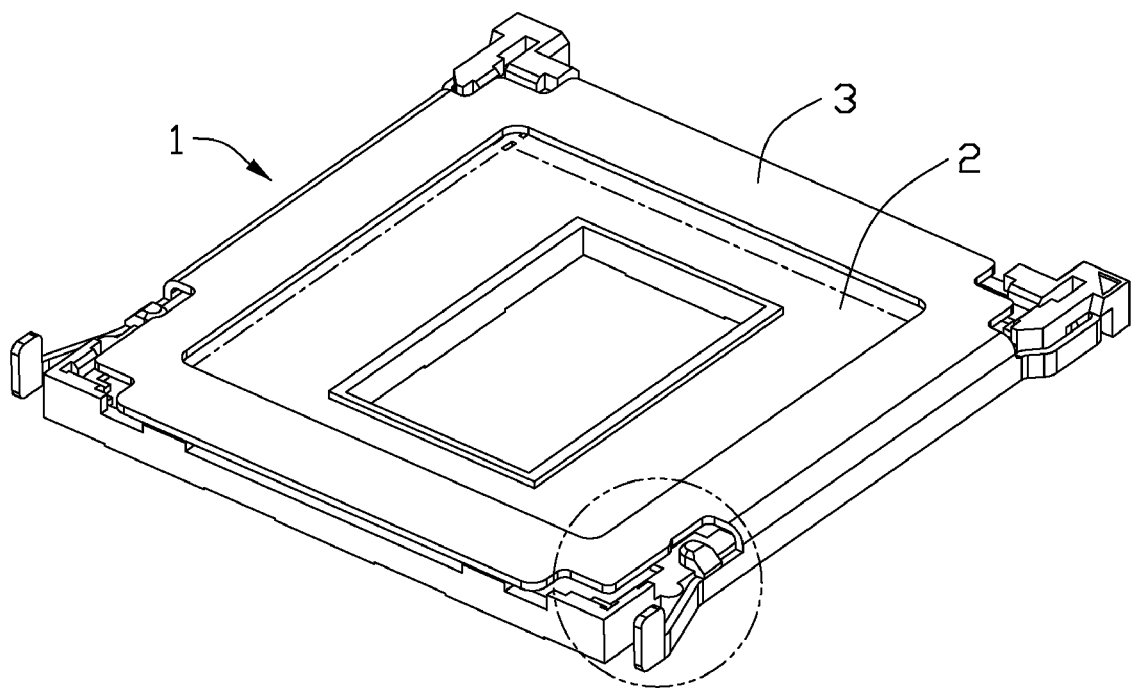
FIG. 1 is an assembled, perspective view of a socket connector with a preferred embodiment of the present invention, illustrating a retention plate in a closed position.
Figure 2:
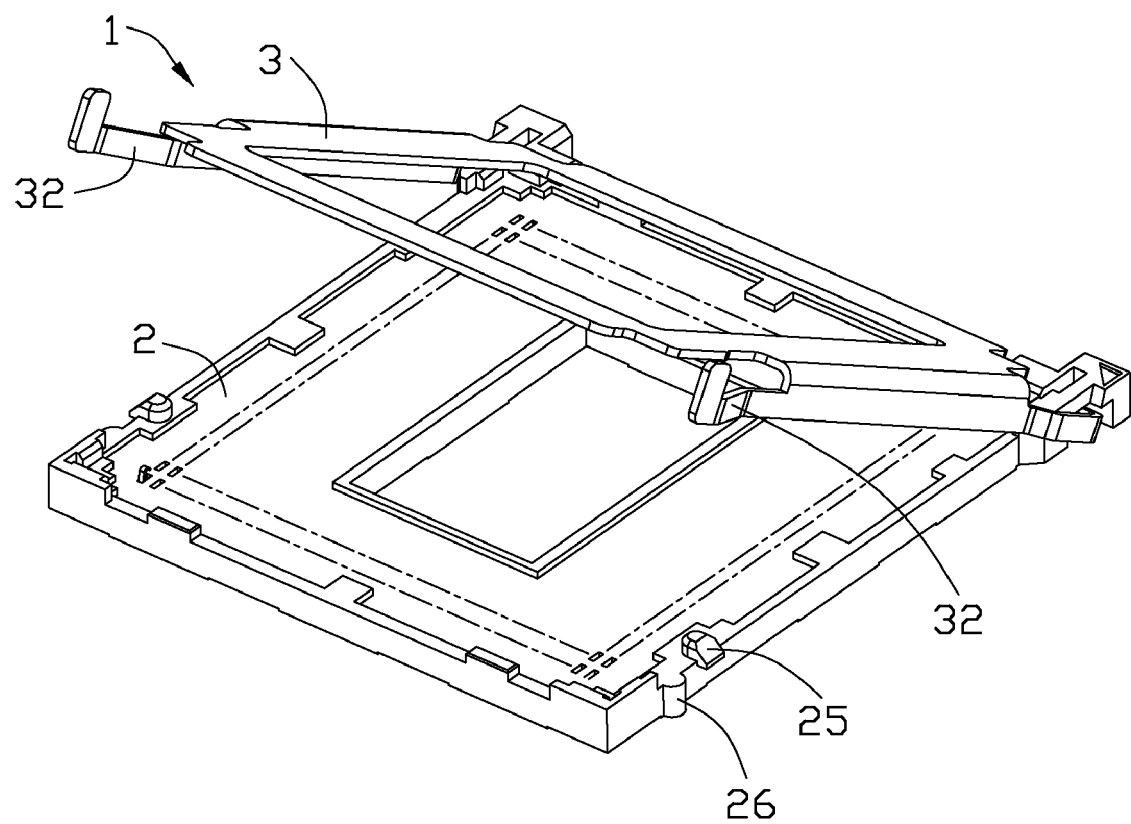
FIG. 2 is another assembled, perspective view of the socket connector with the preferred embodiment of the present invention, illustrating the retention plate in an opened position.
Figure 3:
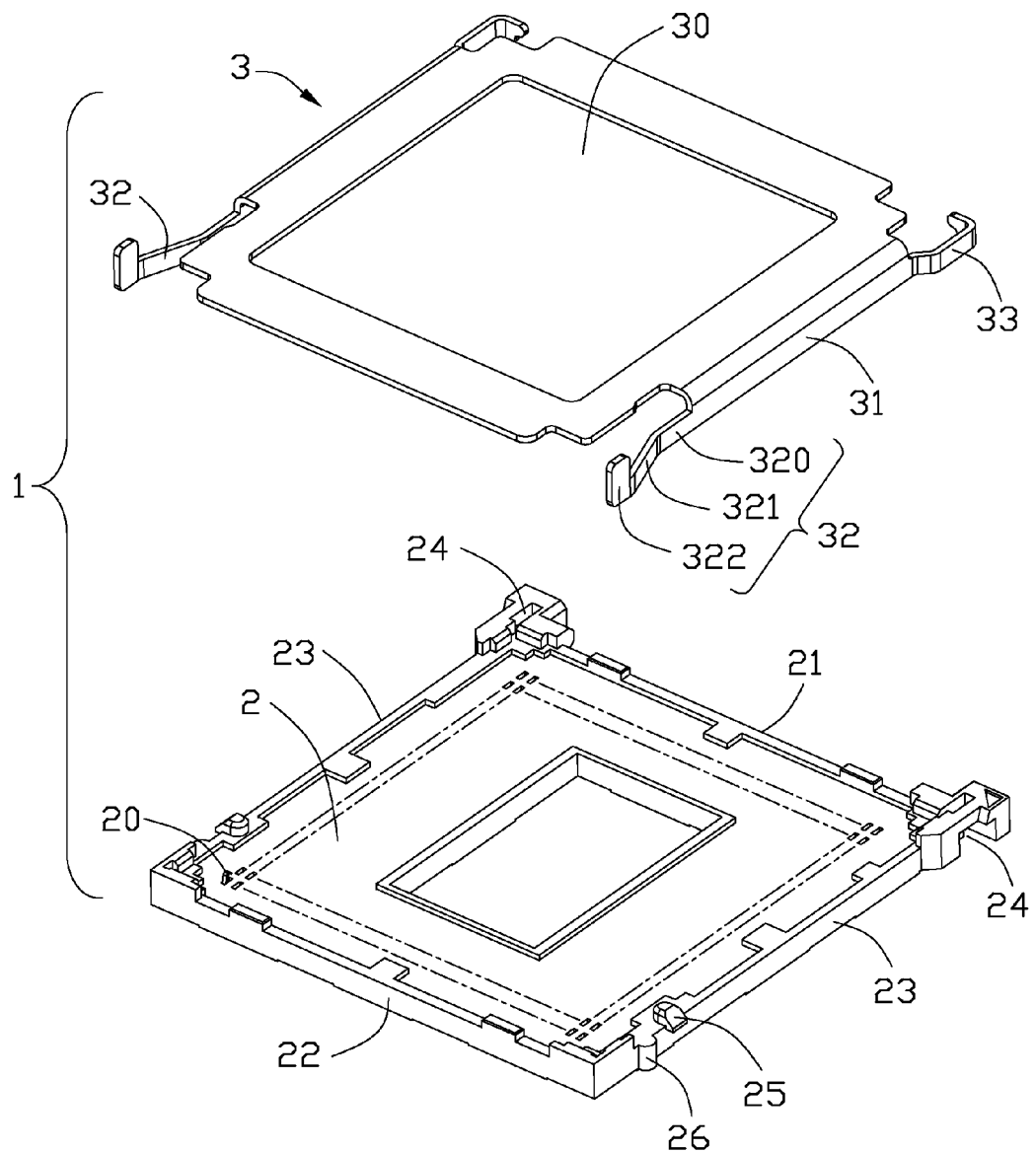
FIG. 3 is an exploded, perspective view of the socket connector in accordance to the preferred embodiment of the present invention.
Figure 4:
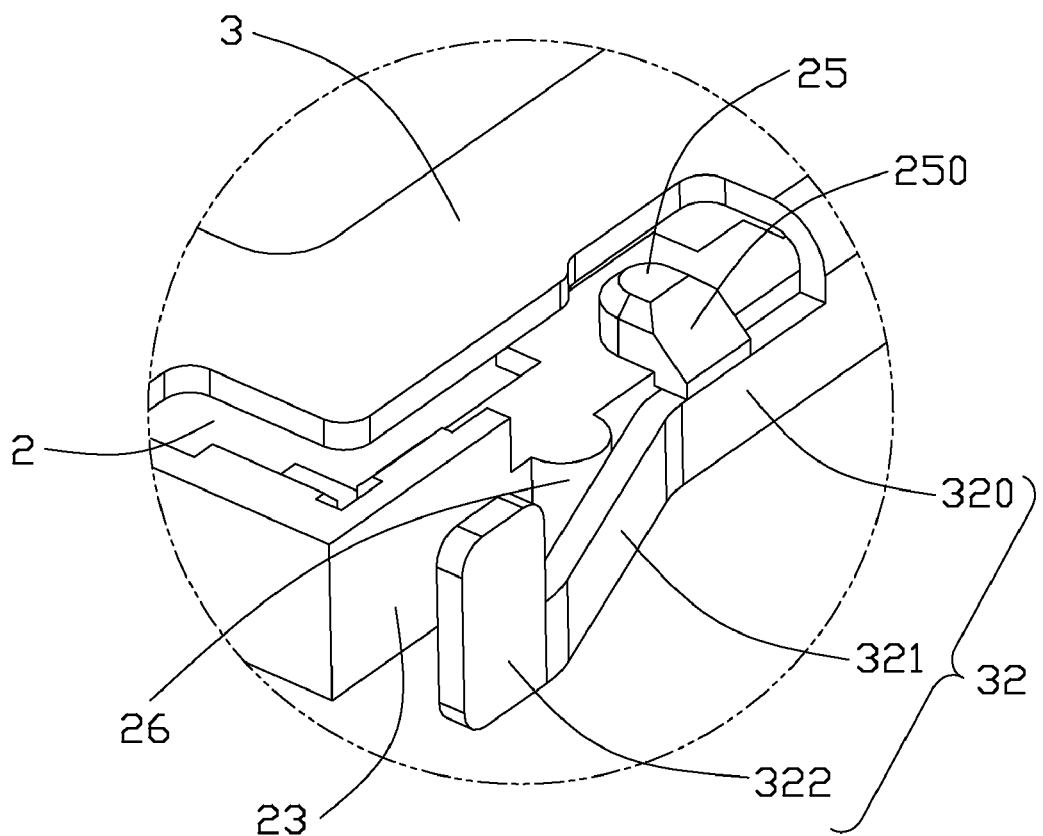
FIG. 4 is an enlarged view of the part encircled in FIG. 1.
Figure 5:
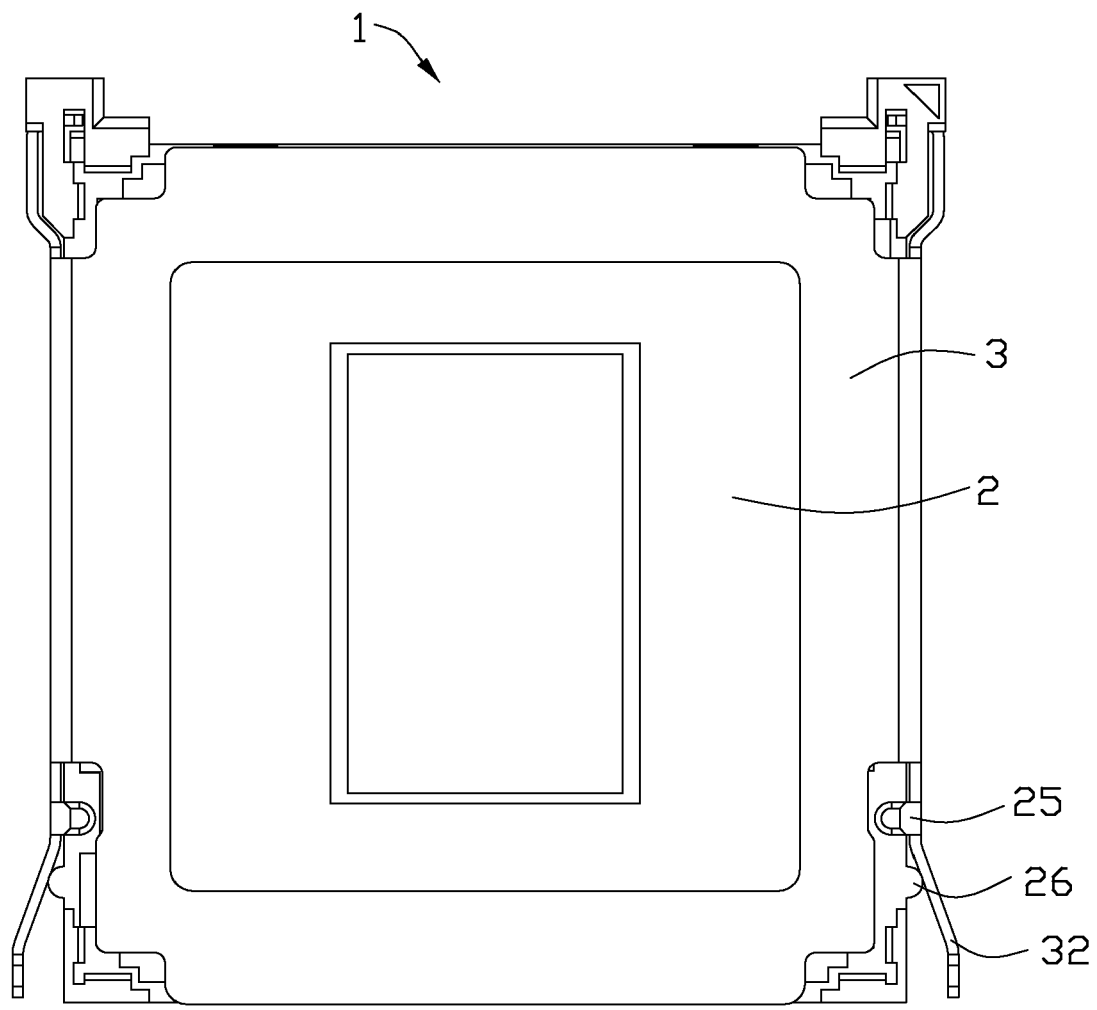
FIG. 5 is a top view of the socket connector as shown in FIG. 1.

FIG. 1 and FIG. 2 illustrate assembled views of a socket connector 1 made in accordance with the present invention. FIG. 3 illustrates an exploded view of the socket connector 1. The socket connector 1 includes a socket body 2 and a retention plate 3 pivotally connected to a rear end of the socket body 2. The socket body 2 and the retention plate 3 are both substantially rectangular in shape. The socket body 2 is further provided with a plurality of contacts 20 retained therein in an array for electrical connection with an IC package that is seated upon the socket body 1.

Particularly referring to FIG. 2 and FIG. 3, the socket body 2 has a rear wall 21, a front wall 22 opposite to the rear wall 21, and a pair of sidewalls 23. The retention plate 3 defines an opening 30 at a central position thereof, allowing exposure of a top surface of the IC package seated upon the socket body 2. A pair of opposite skirts 31 extend downwardly from the retention plate 3 and will be located close to the sidewalls 23 of the socket body 2 when the retention plate 3 is moved in the closed position as shown in FIG. 1. At opposite ends of the rear wall 21 there are provided with a pair of mounting seats 24, and in correspondence, a pair of hinges 33 are provided to extend rearwardly from the skirts 31 of the retention plate 3 to engage with the mounting seats 24.

To achieve latching and releasing of the retention plate 3, a pair of latching arms 32 are formed on the retention plate 3 and extend forwardly from the skirts 31 opposite to the hinges 33. The latching arm 32 further includes a latching section 320 connected with the skirt, a handle 322 at a free end thereof, and a lever section 321 interconnecting the latching section 320 and the handle 322. The lever section 321 extends outwardly and forwardly such that the handle 322 is disposed away from the sidewall 23 of the socket body 2. The sidewall 23 is formed with a latching block 25 and a pivot 26 to engage with the latching arm 22.

The latching block 25 is formed on a top edge of the sidewall 23 and extends outwardly beyond an outer surface of the same. The pivot 26 is formed on the outer surface of the sidewall 23 and is closer to the front wall 22 than the latching block 25. When the retention plate 3 is moved toward socket body 2, the latching arm 32 travels down a chamfered surface 250 of the latching block 25 until snaps into place underneath the latching block 25, and the latching of the retention plate 3 is therefore achieved. When releasing of the retention plate 3 is requested, a user should press the two handles 322 of the latching arm 22 by two fingers of one hand. The lever section 321 engages the pivot 26 and actuates the latching section 320 to move and get out of the engagement with the latching block 25. The retention plate 3 is subsequently able to be moved away from the socket body 2 and is thus released.

The present invention adopts a leverage principle to latch or release a retention plate 3. Not only the total structure of the latching-releasing arrangement is simplified, but also it is convenient for a user to operate.

According to the preferred embodiment of the present invention, the latching-releasing arrangements are set at opposite sides of the socket connector 1. In addition, using only one such latching-releasing arrangement that is set at the front side of the socket connector is also feasible under a condition that proper amendments to the structures of the socket body and the retention plate are made.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. A socket connector, comprising:
 a socket body having a plurality of contacts received therein, the socket body having a substantially rectangular structure defining a rear wall, a front wall, and a pair of opposite sidewalls, each sidewall is formed with a latching block and a pivot adjacent each other; and
 a retention plate pivotally connected to a rear end of the socket body, the retention plate having a body portion and a pair of latching arms extending downwardly from the body portion;
 wherein the latching arm comprising a latching section extending from the body portion to engage with the latching block, a lever section extending from the latching section to engage with the pivot and a handle extending from the lever section;
 wherein the latching section, the lever section and the handle are located on the retention plate, not on the body portion.

2. The socket connector as claimed in claim 1, wherein the latching block is formed on a top edge of the sidewall and extends outwardly beyond an outer surface of the sidewall.

3. The socket connector as claimed in claim 1, wherein the pivot is formed on an outer surface of the sidewall and is closer to the front wall than the latching block.

4. The socket connector as claimed in claim 1, wherein the retention plate has a pair of opposite skirts extending downwardly therefrom and said latching arms extend forwardly from the skirts respectively.

5. The socket connector as claimed in claim 1, wherein the lever section of the latching arm extends outwardly and forwardly such that the handle is disposed away from the sidewall of the socket body.

6. A socket connector, comprising:
 a socket body having a plurality of contacts received therein;
 a retention plate pivotally connected to the rear end of the socket body; and
 a latching-releasing arrangement comprising a latching arm formed on the retention plate, a pivot either formed on the socket body or the retention plate, and a latching block formed on the socket body, the latching arm deflecting about the pivot when being pressed inwardly to disengage the latching block such that the retention plate is released from the socket body.

7. The socket connector as claimed in claim 6, wherein the latching arm comprises a latching section engaged with the latching block, a lever section extending from the latching section to engage with the pivot and a handle extending from the lever section.

8. The socket connector as claimed in claim 7, wherein the lever section of the latching arm extends outwardly and forwardly such that the handle is disposed away from the socket body.

9. The socket connector as claimed in claim 6, wherein the socket body has a pair of sidewalls each is equipped with one said latching arrangement.

10. The socket connector as claimed in claim 9, wherein the latching block is formed on a top edge of the sidewall and extends outwardly beyond an outer surface of the sidewall.

11. The socket connector as claimed in claim 10, wherein the pivot is formed on an outer surface of the sidewall and is closer to the front wall than the latching block.

12. The socket connector as claimed in claim 6, wherein the retention plate has a body portion and a pair of opposite skirts extending downwardly therefrom and said latching arms extend forwardly from the skirts respectively and are disconnected with the body portion.

13. A socket connector comprising:
 an insulative housing defining therein a receiving cavity upwardly communicating with an exterior;
 a plurality of contacts disposed in the housing with contacting sections upwardly extending into the receiving cavity;

a metallic cover pivotally mounted around one end of the housing between open and closed positions;

a latching block located around a side of the housing; and a latching arm extending forwardly from the cover and defining a latching section lockable with latching block and a handle adapted to be transversely inwardly pressed to have said latching section transversely outwardly moved for leaving the latching block.

14. The socket connector as claimed in claim 13, wherein the handle and the latching section performs a lever operation therebetween.

15. The socket connector as claimed in claim 13, wherein the latching block is unitarily formed with the housing.

16. The socket connector as claimed in claim 13, wherein the latching arm is unitarily formed with the cover.

17. The socket connector as claimed in claim 13, wherein at least one of the housing and the cover defines a pivot structure located between the handle and the latching section.

18. The socket connector as claimed in claim 17, wherein said pivot structure is formed on the housing.

19. The socket connector as claimed in claim 13, wherein said side is a lateral side.

20. The socket connector as claimed in claim 13, wherein the latching section is essentially located at an opposite end of the housing with regard to the end where the cover is pivotally mounted.

* * * * *